United States Patent [19]

Hoshi et al.

[11] Patent Number: 4,783,431

[45] Date of Patent: Nov. 8, 1988

[54] INSULATIVE CERAMIC COMPOSITION

[75] Inventors: Kenichi Hoshi; Shoichi Tosaka; Takashi Yoshimi, all of Tokyo, Japan

[73] Assignee: Taiyo Yuden Kabushiki Kaisha, Tokyo, Japan

[21] Appl. No.: 71,642

[22] Filed: Jul. 9, 1987

[51] Int. Cl.$^4$ ............................................. C04B 35/10
[52] U.S. Cl. .................................. 501/153; 501/128; 501/154
[58] Field of Search ....................... 501/128, 153, 154

[56] References Cited

U.S. PATENT DOCUMENTS 4,396,720 8/1983 Beall et al. ............................ 501/78
4,519,828 5/1985 Beall et al. ............................ 501/5
4,526,873 7/1985 Beall et al. ............................ 501/67

*Primary Examiner*—William R. Dixon, Jr.
*Assistant Examiner*—Anthony Green
*Attorney, Agent, or Firm*—Flynn, Thiel, Boutell & Tanis

[57] ABSTRACT

An insulative ceramic composition comprising from 25 to 60 wt % of $Al_2O_3$, from 10 to 40 wt % of $SiO_2$, from 3 to 30 wt % of from $B_2O_3$, from 1 to 15 wt % of MgO, from 0.2 to 10 wt % of $Cr_2O_3$, from 0.1 to 3 wt % of $Li_2O$, and from 1 to 20 wt % of at least one member selected from the group consisting of CaO, SrO and BaO. The ceramic composition has a small coefficient of linear expansion and can avoid cracking when undergoing thermal shock.

6 Claims, No Drawings

4,783,431

INSULATIVE CERAMIC COMPOSITION

BACKGROUND OF THE INVENTION

1. Field of the Invention

This invention relates to the art of multilayer wiring and more particularly, to an insulative ceramic composition useful as a material for multilayer wiring boards.

2. Description of the Prior Art

As is known in the art, alumina ceramic compositions have been widely used as a material for multilayer circuit boards because of the good insulating property thereof. A typical ceramic composition for this purpose is obtained by firing or sintering starting materials made, for example, of about 96% of $Al_2O_3$ powder and the balance of $SiO_2$, MgO, CaO and the like powders, in a reductive atmosphere at a temperature of from 1500° to 1600° C. For the printing of a conductor in the inside of the board, a conductive paste comprised chiefly of Mo or W has been used.

Since the alumina ceramic composition has a large coefficient of linear expansion not lower than $7.5 \times 10^{-6}/°C.$, it is liable to thermal shock. It has been frequently experienced that when the multilayer circuit board made of the composition is subjected to thermal shock at a difference in temperature not smaller than several degrees, cracks are inevitably produced. Accordingly, for soldering electronic parts on a multilayer wiring board, a so-called preheating process is required in which the board is preheated gently to a temperature near the melting point of a solder.

SUMMARY OF THE INVENTION

It is therefore an object of the invention to provide an insulative ceramic composition which overcomes the problems of the prior art alumina-based insulative ceramic composition.

It is another object of the invention to provide an insulative ceramic composition which has a smaller coefficient of linear expansion than known ceramic compositions.

It is a further object of the invention to provide an insulative ceramic composition which has a very small coefficient of linear expansion of from 3.0 to $6.0 \times 10^{-6}/°C.$, whereby the multilayer circuit board fabricated from the composition is not cracked when undergoing thermal shock usually experienced during soldering of electric or electronic parts and thus, a preheating step hitherto required for the soldering step is not necessary.

The above objects can be achieved, according to the invention, by an insulative ceramic composition which comprises from 25 to 60 wt % of $Al_2O_3$, from 10 to 40 wt % of $SiO_2$, from 3 to 30 wt % of $B_2O_3$, from 1 to 15 wt % of MgO, from 0.2 to 10 wt % of $Cr_2O_3$, from 0.1 to 3 wt % of $Li_2O$, and from 1 to 20 wt % of at least one member selected from the group consisting of CaO, SrO and BaO.

DETAILED DESCRIPTION OF THE INVENTION

The insulative ceramic composition according to the invention has such a formulation as defined above. The critical amounts of the respective oxide components are experimentally determined as is particularly described in examples appearing hereinafter. The reasons for the determination of the critical amounts are described below.

The content of $Al_2O_3$ is in the range of from 25 to 60 wt %. If the amount is less than 25 wt %, bubbles are undesirably produced in the ceramic during firing. If the amount is over 60 wt %, the resultant ceramic is not satisfactory with respect to the resistivity, $\rho$, or becomes low in the resistivity, thus being unfavorable when applied as a multilayer wiring board.

The content of $SiO_2$ is in the range of from 10 to 40 wt %. Outside the above range, the resultant ceramic becomes low in resistivity and thus is not suitable for use as a material for the multilayer wiring board.

The content of $B_2O_3$ is in the range of from 3 to 30 wt %. If the content is less than 3 wt %, the resistivity, $\rho$, becomes low whereas when the content is over 30 wt %, foam or bubbles are formed in the ceramic. Thus, the content should be in the range defined above.

The content of MgO is the range of from 1 to 15 wt %. In smaller amounts, bubbles are undesirably produced, whereas over 15 wt%, the resistivity, $\rho$, becomes low. Thus, the content should be as defined above.

the content of $Cr_2O_3$ is in the range of from 0.2 to 10 wt %. If the content is less than 0.2 wt %, the resultant ceramic becomes so transparent that a wiring pattern in the inside of a multilayer wiring board can be seen, thus being unfavorable from the standpoint of secrecy. If the content is over 10 wt %, the resistivity, $\rho$, becomes undesirably low.

The content of $Li_2O$ is in the range of from 0.1 to 3 wt %. If the content is less than 0.1 wt %, the coefficient of linear expansion, $\alpha$, becomes undesirably high, whereas if the content is over 3 wt %, the resistivity, $\rho$, becomes low. Thus the content should be within the range defined above.

Moreover, the ceramic composition of the invention comprises at least one oxide selected from CaO, SrO and BaO in the range of from 1 to 20 wt %. If two or more oxides are used, the total amount should be within a range of from 1 to 20 wt %. If the amount is less than 1 wt % or over 20 wt %, the resistivity undesirably becomes low and the ceramic is not suitable for use as a multilayer wiring board.

The present invention is described in more detail by way of examples.

EXAMPLE 1

Sample 1 was prepared in the following manner. 180 g of an $Al_2O_3$ powder, 30 g of a $SiO_2$ powder, 35.7 g of a $B_2O_3$ powder, 15 g of an MgO powder, 9.0 g of a $Cr_2O_3$ powder, 0.75 g of a $Li_2CO_3$ powder, and 53.55 g of a $CaCO_3$ powder were weighed. The carbonate powders of Li and Ca used were stable in air.

The above powders were placed in a ceramic ball mill and subjected to ball milling for about 15 hours to effect wet mixing. Subsequently, the mixture was calcined in air at a temperature of 800° C. and was again placed in a ceramic ball mill, followed by ball milling for about 15 hours to reduce the mixture into pieces.

Thereafter, 14 g of polyvinylbutyral resin, 14 g of dibutyl phthalate, 60 g of acetone and 1 g of oleic acid were added to 200 g of the mixed powder and agitated to obtain a slurry. The slurry was applied by a doctor blade method to form an elongated non-fired or non-sintered ceramic sheet with a thickness of 0.25 mm, followed by cutting into smaller sheets having a size of 10 cm².

Three types of test pieces were made from the cut non-fired ceramic sheets. A first test piece was in the form of a disk having a diameter of 16 cm punched from the cut sheet. A second test piece was one which was obtained superposing and compressing 17 sheets and cutting the compressed article into pieces having a length of 36 mm and a width of 4 mm. The thickness was about 4 mm. A third test piece was obtained by printing a conductive paste comprised mainly of Ni in a wiring pattern onto the cut sheet, and superposing and compressing 6 printed sheets, and cutting the compressed article into pieces having a length of 30 mm and a width of 15 mm with a thickness of about 1.5 mm.

These test pieces were fired as follows: a furnace for the firing was heated at a rate of 100° C./hr in air, and the air in the furnace was replaced by a mixed gas of 97% by volume of $N_2$ and and 3% by volume of $H_2$ when the furnace temperature reached 600° C.; The furnace was further heated up to 950° C., at which temperature it was maintained for 3 hours and then cooled down to normal temperature while maintaining the atmosphere of said mixed gas therein.

Subsequently, the fired test pieces were, respectively, tested as follows.

The first test piece of the disk form was applied with an In-Ga alloy on opposite main surfaces thereof to from electrodes having a diameter of 10 mm, followed by measurement of the specific inductive capacity, $\epsilon$, the quality factor, Q, and the resistivity, $\rho$, (ohm-cm). The specific inductive capacity, $\epsilon$, was calculated from the electrostatic capacitance measured at a temperature of 25° C. at a frequency of 1 MHz. The Q value was measured under the same conditions as the electrostatic capacitance. The resistivity, $\rho$, was calculated from an insulation resistance which was obtained after 60 seconds after application of the D.C. voltage of 500 volts.

The second test piece fabricated by superposing 17 ceramic sheets was subjected to measurement of a coefficient of linear expansion, $\alpha$, (/°C.) at temperatures of 20° to 500° C.

The third test piece having the printed wiring pattern of Ni was not preheated and was dipped at normal temperature into a molten solder of 250° C. for 3 seconds, pulled up and allowed to determine cool down to normal temperature. This piece was checked to whether or not cracks were produced. Moreover, the test piece was also checked with respect to the light-shielding property by determining whether or not the wiring pattern in the inside of the piece was seen. In this connection, when the wiring pattern was not seen through, the light-shielding property was determined as being good, and when the pattern was seen through, the light-shielding property was determined as bad.

EXAMPLE 2

The general procedure of Example 1 was repeated using ceramic compositions indicated in the attached table, thereby obtaining samples 2 to 56. Three types of test pieces were made from each sample and subjected to tests under the same conditions as in sample 1. It should be noted that the respective samples were fired or sintered at the different temperatures indicated in the table. Moreover, the samples 2 to 56 were sintered in a non-oxidative atmosphere similar to sample 1a, but samples 1b, 5b, 10b, 15b, 20b, 25b, 30b, 35b, 40b, 45b, 50b and 55b were sintered in air by the use of a similar temperature profile. In the latter case, for printing a wiring pattern, a conductive paste mainly composed of Pd was used instead of a conductive paste mainly composed of Ni.

As will be apparent from the above results, the ceramic compositions used could be sintered or fired at 850° to 1000° C. and had a coefficient of linear expansion of from 3.0 to $6.0 \times 10^{-6}$/°C. In all the compositions, no cracks were found in the dipping test using a molten solder with a good light-shielding property. It should be noted that although not particularly indicated in the above table, the specific inductive capacity, $\epsilon$, of these ceramics is in the range from 5 to 8, the Q value ranges from 1000 to 2000, and the resistivity, $\rho$, ranges from $1 \times 10^{14}$ to $3 \times 10^{15}$ ohms-cm.

TABLE

| Sample No. | Composition | Sintering Temperature | Coefficient of Linear Expansion, $\alpha$ |
|---|---|---|---|
| 1 | $Al_2O_3$ 60.0, MgO 5.0, CaO 10.0 $SiO_2$ 10.0, $Cr_2O_3$ 3.0, $B_2O_3$ 11.9, $Li_2O$ 0.1 | 950 | 5.9 |
| 2 | $Al_2O_3$ 50.0, MgO 5.0, $SiO_2$ 20.0, $Cr_2O_3$ 10.0, SrO 1.0 $B_2O_3$ 13.0, $Li_2O$ 1.0 | 1000 | 4.2 |
| 3 | $Al_2O_3$ 30.0, MgO 12.5, CaO 7.0 $SiO_2$ 20.0, $Cr_2O_3$ 2.5, $B_2O_3$ 15.0, $Li_2O$ 0.1 | 950 | 3.5 |
| 4 | $Al_2O_3$ 40.0, MgO 6.5, CaO 10.0 $SiO_2$ 30.0, $Cr_2O_3$ 0.4, $B_2O_3$ 13.0, $Li_2O$ 0.1 | 900 | 5.0 |
| 5 | $Al_2O_3$ 30.0, MgO 9.0, $SiO_2$ 40.0, $Cr_2O_3$ 5.0, SrO 4.0 $B_2O_3$ 7.0, $Li_2O$ 1.0, BaO 4.0 | 900 | 4.2 |
| 6 | $Al_2O_3$ 40.0, MgO 3.0, CaO 3.0 $SiO_2$ 35.0, $Cr_2O_3$ 10.0 SrO 3.0 $B_2O_3$ 3.0, $Li_2O$ 3.0 | 1000 | 3.5 |
| 7 | $Al_2O_3$ 55.0, MgO 10.0, CaO 5.0 $SiO_2$ 10.0, $Cr_2O_3$ 0.2, SrO 7.0 $B_2O_3$ 9.8 $Li_2O$ 3.0 | 900 | 3.8 |
| 8 | $Al_2O_3$ 45.0, MgO 8.0, CaO 10.0 $SiO_2$ 20.0, $Cr_2O_3$ 5.0, $B_2O_3$ 11.9, $Li_2O$ 0.1, | 900 | 5.0 |
| 9 | $Al_2O_3$ 50.0, MgO 3.0, CaO 6.0 $SiO_2$ 25.0, $Cr_2O_3$ 5.0, $B_2O_3$ 10.0, $Li_2O$ 1.0 | 950 | 4.3 |
| 10 | $Al_2O_3$ 25.0, MgO 4.0, CaO 10.0 $SiO_2$ 30.0, $Cr_2O_3$ 1.0, SrO 5.0 $B_2O_3$ 17.0, $Li_2O$ 3.0, BaO 5.0 | 950 | 4.0 |
| 11 | $Al_2O_3$ 60.0, MgO 1.0, CaO 3.0 $SiO_2$ 25.0, $Cr_2O_3$ 0.4, SrO 3.0 $B_2O_3$ 7.5, $Li_2O$ 0.1 | 900 | 5.0 |
| 12 | $Al_2O_3$ 25.0, MgO 9.0, CaO 10.0 $SiO_2$ 35.0, $Cr_2O_3$ 1.0, $B_2O_3$ 9.0, $Li_2O$ 1.0, BaO 10.0 | 850 | 5.0 |
| 13 | $Al_2O_3$ 60.0, MgO 9.0, CaO 10.0 $SiO_2$ 10.0, $Cr_2O_3$ 2.0, SrO 6.0 $B_2O_3$ 10.0, $Li_2O$ 1.0, BaO 3.0 | 1000 | 5.0 |
| 14 | $Al_2O_3$ 50.0, MgO 10.0, CaO 10.0 $SiO_2$ 10.0, $Cr_2O_3$ 7.0 $B_2O_3$ 9.9, $Li_2O$ 0.1, BaO 3.0 | 1000 | 5.5 |
| 15 | $Al_2O_3$ 60.0, MgO 1.0 CaO 6.0 $SiO_2$ 20.0, $Cr_2O_3$ 1.0, $B_2O_3$ 9.0 $Li_2O$ 3.0 | 950 | 3.0 |
| 16 | $Al_2O_3$ 50.0, MgO 10.0 $SiO_2$ 20.0, $Cr_2O_3$ 1.0, SrO 10.0 $B_2O_3$ 8.0, $Li_2O$ 1.0, | 900 | 4.2 |
| 17 | $Al_2O_3$ 30.0, MgO 8.9, $SiO_2$ 20.0, $Cr_2O_3$ 1.0, SrO 10.0 $B_2O_3$ 30.0, $Li_2O$ 0.1 | 850 | 5.0 |
| 18 | $Al_2O_3$ 50.0, MgO 10.0, CaO 1.0 $SiO_2$ 30.0, $Cr_2O_3$ 1.0, $B_2O_3$ 5.0, $Li_2O$ 3.0, | 1000 | 3.6 |
| 19 | $Al_2O_3$ 40.0, MgO 5.0, CaO 8.0 $SiO_2$ 30.0, $Cr_2O_3$ 2.0, SrO 2.0 $B_2O_3$ 10.0, $Li_2O$ 1.0, BaO 2.0 | 900 | 4.6 |
| 20 | $Al_2O_3$ 40.0, MgO 4.0, CaO 6.0 $SiO_2$ 40.0, $Cr_2O_3$ 0.9, $B_2O_3$ 9.0, $Li_2O$ 0.1 | 950 | 5.3 |
| 21 | $Al_2O_3$ 25.0, MgO 4.0, CaO 3.0 | 900 | 3.0 |

TABLE-continued

| Sample No. | Composition | Sintering Temperature | Coefficient of Linear Expansion, α |
|---|---|---|---|
| 22 | $SiO_2$ 40.0, $Cr_2O_3$ 5.0, $B_2O_3$ 20.0, $Li_2O$ 3.0 $Al_2O_3$ 50.0, MgO 5.0, | 950 | 4.2 |
| 23 | $SiO_2$ 25.0, $Cr_2O_3$ 2.0, SrO 7.0 $B_2O_3$ 10.0, $Li_2O$ 1.0 $Al_2O_3$ 40.0, MgO 5.0 CaO 7.0 | 950 | 5.9 |
| 24 | $SiO_2$ 35.0, $Cr_2O_3$ 2.5, $B_2O_3$ 10.4 $Li_2O$ 0.1 $Al_2O_3$ 50.0, MgO 7.0 | 900 | 5.0 |
| 25 | $SiO_2$ 10.0, $Cr_2O_3$ 0.5, SrO 7.0 $B_2O_3$ 17.5, $Li_2O$ 1.0, BaO 7.0 $Al_2O_3$ 55.0, MgO 6.0, $SiO_2$ 10.0, $Cr_2O_3$ 3.0, $B_2O_3$ 3.0, $Li_2O$ 3.0, BaO 10.0 | 1000 | 3.2 |
| 26 | $Al_2O_3$ 50.0, MgO 3.9, $SiO_2$ 30.0, $Cr_2O_3$ 2.0, SrO 5.0 $B_2O_3$ 9.0, $Li_2O$ 0.1, | 950 | 5.0 |
| 27 | $Al_2O_3$ 30.0, MgO 15.0 CaO 8.0 $SiO_2$ 30.0, $Cr_2O_3$ 2.0, $B_2O_3$ 14.0 $Li_2O$ 1.0, | 950 | 4.3 |
| 28 | $Al_2O_3$ 25.0, MgO 6.0, CaO 6.0 $SiO_2$ 40.0, $Cr_2O_3$ 2.0, $B_2O_3$ 14.0, $Li_2O$ 3.0, BaO 4.0 | 900 | 3.2 |
| 29 | $Al_2O_3$ 40.0, MgO 4.0, $SiO_2$ 25.0, $Cr_2O_3$ 1.0, SrO 5.0 $B_2O_3$ 14.0 $Li_2O$ 1.0 | 900 | 4.9 |
| 30 | $Al_2O_3$ 25.0, MgO 2.9, CaO 4.0 $SiO_2$ 35.0, $Cr_2O_3$ 3.0, $B_2O_3$ 30.0, $Li_2O$ 0.1 | 850 | 6.0 |
| 31 | $Al_2O_3$ 60.0, MgO 9.0 CaO 9.0 $SiO_2$ 10.0, $Cr_2O_3$ 1.0, $B_2O_3$ 8.0 $Li_2O$ 3.0 | 1000 | 3.5 |
| 32 | $Al_2O_3$ 55.0, MgO 4.7 $SiO_2$ 20.0, $Cr_2O_3$ 0.2, SrO 7.0 $B_2O_3$ 13.0, $Li_2O$ 0.1, | 950 | 4.6 |
| 33 | $Al_2O_3$ 50.0, MgO 1.0, CaO 6.0 $SiO_2$ 25.0, $Cr_2O_3$ 10.0 $B_2O_3$ 7.0, $Li_2O$ 1.0, | 950 | 4.0 |
| 34 | $Al_2O_3$ 40.0, MgO 3.0, $SiO_2$ 30.0, $Cr_2O_3$ 1.0, SrO 9.0 $B_2O_3$ 14.0, $Li_2O$ 3.0 | 850 | 3.7 |
| 35 | $Al_2O_3$ 30.0, MgO 15.0 $SiO_2$ 40.0, $Cr_2O_3$ 0.6, SrO 2.0 $B_2O_3$ 12.3, $Li_2O$ 0.1, | 950 | 4.6 |
| 36 | $Al_2O_3$ 30.0, MgO 10.0, CaO 5.0 $SiO_2$ 35.0, $Cr_2O_3$ 1.0, SrO 4.0 $B_2O_3$ 14.0, $Li_2O$ 1.0 | 950 | 5.0 |
| 37 | $Al_2O_3$ 50.0, MgO 5.0, $SiO_2$ 10.0, $Cr_2O_3$ 1.0, $B_2O_3$ 9.0 $Li_2O$ 1.0, BaO 14.0 | 1000 | 4.5 |
| 38 | $Al_2O_3$ 40.0, MgO 5.0, CaO 10.0 $SiO_2$ 20.0, $Cr_2O_3$ 2.0, $B_2O_3$ 20.0, $Li_2O$ 3.0 | 850 | 3.0 |
| 39 | $Al_2O_3$ 50.0, MgO 4.0 $SiO_2$ 30.0, $Cr_2O_3$ 0.5, SrO 4.0 $B_2O_3$ 7.4, $Li_2O$ 0.1, BaO 4.0 | 900 | 6.0 |
| 40 | $Al_2O_3$ 35.0, MgO 5.0 $SiO_2$ 40.0, $Cr_2O_3$ 5.0, SrO 1.0 $B_2O_3$ 13.0, $Li_2O$ 1.0 | 950 | 4.5 |
| 41 | $Al_2O_3$ 30.0, MgO 6.0, CaO 9.0 $SiO_2$ 25.0, $Cr_2O_3$ 10.0 $B_2O_3$ 17.0, $Li_2O$ 3.0 | 900 | 4.0 |
| 42 | $Al_2O_3$ 50.0, MgO 9.9, CaO 5.0 $SiO_2$ 10.0, $Cr_2O_3$ 5.0, $B_2O_3$ 20.0, $Li_2O$ 0.1 | 900 | 6.0 |
| 43 | $Al_2O_3$ 45.0, MgO 10.0, CaO 15.0 $SiO_2$ 10.0, $Cr_2O_3$ 1.5, $B_2O_3$ 18.4, $Li_2O$ 0.1, | 900 | 4.9 |
| 44 | $Al_2O_3$ 40.0, MgO 8.0, CaO 3.0 $SiO_2$ 20.0, $Cr_2O_3$ 3.0, SrO 5.0 $B_2O_3$ 20.0, $Li_2O$ 1.0 | 900 | 4.9 |
| 45 | $Al_2O_3$ 45.0, MgO 6.0, $SiO_2$ 30.0, $Cr_2O_3$ 3.0, $B_2O_3$ 10.0 $Li_2O$ 1.0, BaO 5.0 | 900 | 4.0 |
| 46 | $Al_2O_3$ 35.0, MgO 3.9, CaO 5.0 $SiO_2$ 40.0, $Cr_2O_3$ 1.0, $B_2O_3$ 10.0, $Li_2O$ 0.1, BaO 5.0 | 950 | 4.9 |
| 47 | $Al_2O_3$ 30.0, MgO 9.0 $SiO_2$ 35.0, $Cr_2O_3$ 2.0, SrO 6.0 $B_2O_3$ 15.0, $Li_2O$ 3.0 | 950 | 3.5 |
| 48 | $Al_2O_3$ 40.0, MgO 4.0 $SiO_2$ 10.0, $Cr_2O_3$ 5.0, $B_2O_3$ 30.0, $Li_2O$ 3.0, BaO 8.0 | 900 | 3.0 |
| 49 | $Al_2O_3$ 55.0, MgO 4.0, CaO 5.0 $SiO_2$ 20.0, $Cr_2O_3$ 4.0, SrO 4.0 $B_2O_3$ 7.0, $Li_2O$ 1.0, | 1000 | 4.5 |
| 50 | $Al_2O_3$ 40.0, MgO 10.0 CaO 20.0 $SiO_2$ 20.0, $Cr_2O_3$ 0.2, $B_2O_3$ 9.7, $Li_2O$ 0.1 | 950 | 5.2 |
| 51 | $Al_2O_3$ 55.0, MgO 2.0, CaO 3.0 $SiO_2$ 30.0, $Cr_2O_3$ 1.0, SrO 3.0 $B_2O_3$ 3.0, $Li_2O$ 3.0, | 1000 | 3.4 |
| 52 | $Al_2O_3$ 40.0, MgO 4.0, CaO 4.0 $SiO_2$ 30.0, $Cr_2O_3$ 8.0, $B_2O_3$ 13.0, $Li_2O$ 1.0 | 900 | 4.3 |
| 53 | $Al_2O_3$ 30.0, MgO 8.4, CaO 5.0 $SiO_2$ 30.0, $Cr_2O_3$ 1.5, $B_2O_3$ 25.0 $Li_2O$ 0.1, | 850 | 5.0 |
| 54 | $Al_2O_3$ 40.0, MgO 2.0, CaO 5.0 $SiO_2$ 40.0, $Cr_2O_3$ 2.0, $B_2O_3$ 8.0, $Li_2O$ 3.0, | 1000 | 3.0 |
| 55 | $Al_2O_3$ 25.0, MgO 1.5, CaO 2.0 $SiO_2$ 40.0, $Cr_2O_3$ 0.5, $B_2O_3$ 30.0, $Li_2O$ 1.0 | 850 | 4.5 |
| 56 | $Al_2O_3$ 40.0, MgO 4.0 $SiO_2$ 25.0, $Cr_2O_3$ 0.2, $B_2O_3$ 10.7, $Li_2O$ 0.1, BaO 20.0 | 950 | 5.3 |
| 1b | $Al_2O_3$ 60.0, MgO 5.0, CaO 10.0 $SiO_2$ 25.0, $Cr_2O_3$ 3.0, $B_2O_3$ 11.9, $Li_2O$ 0.1, | 950 | 5.7 |
| 5b | $Al_2O_3$ 30.0, MgO 9.0 $SiO_2$ 40.0, $Cr_2O_3$ 5.0, SrO 4.0 $B_2O_3$ 7.0, $Li_2O$ 1.0, BaO 4.0 | 900 | 4.2 |
| 10b | $Al_2O_3$ 25.0, MgO 4.0, CaO 10.0 $SiO_2$ 30.0, $Cr_2O_3$ 1.0, SrO 5.0 $B_2O_3$ 17.0, $Li_2O$ 3.0, BaO 5.0 | 950 | 4.1 |
| 15b | $Al_2O_3$ 60.0, MgO 1.0, CaO 6.0 $SiO_2$ 20.0, $Cr_2O_3$ 1.0, $B_2O_3$ 9.0, $Li_2O$ 3.0 | 950 | 3.3 |
| 20b | $Al_2O_3$ 40.0, MgO 4.0, CaO 6.0 $SiO_2$ 40.0, $Cr_2O_3$ 0.9, $B_2O_3$ 9.0 $Li_2O$ 0.1 | 850 | 5.0 |
| 25b | $Al_2O_3$ 55.0, MgO 6.0, $SiO_2$ 20.0, $Cr_2O_3$ 3.0, $B_2O_3$ 3.0, $Li_2O$ 3.0, BaO 10.0 | 1000 | 3.2 |
| 30b | $Al_2O_3$ 25.0, MgO 2.9, $SiO_2$ 35.0, $Cr_2O_3$ 3.0, $B_2O_3$ 30.0, $Li_2O$ 0.1 | 850 | 5.8 |
| 35b | $Al_2O_3$ 30.0, MgO 15.0, $SiO_2$ 40.0, $Cr_2O_3$ 0.6, SrO 1.0 $B_2O_3$ 12.3, $Li_2O$ 0.1, | 950 | 4.8 |
| 40b | $Al_2O_3$ 35.0, MgO 5.0, $SiO_2$ 40.0, $Cr_2O_3$ 3.0, SrO 1.0 $B_2O_3$ 13.0, $Li_2O$ 1.0, | 950 | 4.3 |
| 45b | $Al_2O_3$ 45.0, MgO 6.0 $SiO_2$ 30.0, $Cr_2O_3$ 3.0, $B_2O_3$ 10.0, $Li_2O$ 1.0, BaO 5.0 | 900 | 4.8 |
| 50b | $Al_2O_3$ 40.0, MgO 10.0, CaO 20.0 $SiO_2$ 20.0, $Cr_2O_3$ 0.2, $B_2O_3$ 9.7, $Li_2O$ 0.1 | 950 | 5.5 |
| 55b | $Al_2O_3$ 25.0, MgO 1.5, CaO 20. $SiO_2$ 40.0, $Cr_2O_3$ 0.5, $B_2O_3$ 30.0, $Li_2O$ 1.0 | 850 | 4.5 |

What is claimed is:

1. An insulative ceramic material made by sintering at from 850° C. to 1000° C., a composition consisting essentially of, calculated as the oxides, from 25 to 60 wt. % of $Al_2O_3$, from 10 to 40 wt. % of $SiO_2$, from 3 to 30 wt. % of $B_2O_3$, from 1 to 15 wt. % of MgO, from 0.2 to 10 wt. % of $Cr_2O_3$, from 0.1 to 3 wt. % of $Li_2O$ and from 1 to 20 wt. % of at least one oxide selected from the group consisting of CaO, SrO and BaO, said ceramic material having a coefficient of linear expansion of from 3.0 to $6.0 \times 10^{-6}$/°C., a specific inductive capacity of from 5 to 8, a Q value of from 1000 to 2000 and a resistivity of from $1 \times 10^{14}$ to $3 \times 10^{15}$ ohms-cm, said ceramic material having a light-shielding property such that a wiring pattern placed inside said ceramic composition cannot be seen.

2. The insulative ceramic composition of claim 1, wherein said composition consists of, calculated as the oxides, 60.0 wt. % of $Al_2O_3$, 20.0 wt. % of $SiO_2$, 9.0 wt. % of $B_2O_3$, 1.0 wt. % of MgO, 1.0 wt. % of $Cr_2O_3$, 3.0 wt. % of $Li_2O$ and 6.0 wt. % of CaO.

3. The insulative ceramic composition of claim 1, wherein said composition consists of, calculated as the oxides, 25.0 wt. % of $Al_2O_3$, 40.0 wt. % of $SiO_2$, 20.0 wt. % of $B_2O_3$, 4.0 wt. % of MgO, 5.0 wt. % of $Cr_2O_3$, 3.0 wt. % of $Li_2O$ and 3.0 wt. % of CaO.

4. The insulative ceramic composition of claim 1, wherein said composition consists of, calculated as the oxides, 40.0 wt. % of $Al_2O_3$, 20.0 wt. % of $SiO_2$, 20.0 wt. % of $B_2O_3$, 5.0 wt. % of MgO, 2.0 wt. % of $Cr_2O_3$, 3.0 wt. % of $Li_2O$ and 10.0 wt. % of CaO.

5. The insulative ceramic composition of claim 1, wherein said composition consists of, calculated as the oxides, 40.0 wt. % of $Al_2O_3$, 10.0 wt. % of $SiO_2$, 30.0 wt. % of $B_2O_3$, 4.0 wt. % of MgO, 5.0 wt. % of $Cr_2O_3$, 3.0 wt. % of $Li_2O$ and 8.0 wt. % of BaO.

6. The insulative ceramic composition of claim 1, wherein said composition consists of, calculated as the oxides, 40.0 wt. % of $Al_2O_3$, 40.0 wt. % of $SiO_2$, 8.0 wt. % of $B_2O_3$, 2.0 wt. % of MgO, 2.0 wt. % of $Cr_2O_3$, 3.0 wt. % of $Li_2O$ and 5.0 wt. % of CaO.

* * * * *